(12) United States Patent
Kanno et al.

(10) Patent No.: US 8,098,415 B2
(45) Date of Patent: Jan. 17, 2012

(54) VIBRATING MIRROR ELEMENT

(75) Inventors: Isaku Kanno, Kyoto (JP); Hidetoshi Kotera, Kyoto (JP); Manabu Murayama, Daito (JP); Hitoshi Fujii, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 387 days.

(21) Appl. No.: 12/503,511

(22) Filed: Jul. 15, 2009

(65) Prior Publication Data
US 2010/0014143 A1    Jan. 21, 2010

(30) Foreign Application Priority Data
Jul. 16, 2008   (JP) .................................. 2008-184913

(51) Int. Cl.
    *G02B 26/08*    (2006.01)
(52) U.S. Cl. ................... 359/224.1; 359/226.2; 359/846
(58) Field of Classification Search .... 359/223.1–224.1, 359/225.1, 226.2, 846, 849
    See application file for complete search history.

(56) References Cited

U.S. PATENT DOCUMENTS

| 5,604,623 | A | 2/1997 | Ji et al. | |
| 5,861,979 | A | 1/1999 | Ji et al. | |
| 5,926,309 | A * | 7/1999 | Little | 359/293 |
| 6,784,771 | B1 * | 8/2004 | Fan | 335/78 |
| 6,844,952 | B2 * | 1/2005 | Dalziel | 359/224.1 |
| 7,524,072 | B2 * | 4/2009 | Laufer et al. | 359/846 |
| 2007/0091482 | A1 | 4/2007 | Chouji et al. | |
| 2008/0100899 | A1 * | 5/2008 | Shimokawa et al. | 359/225 |
| 2008/0291559 | A1 * | 11/2008 | Tanaka et al. | 359/846 |
| 2009/0115918 | A1 | 5/2009 | Asai | |
| 2009/0185251 | A1 * | 7/2009 | Chen et al. | 359/199.3 |

FOREIGN PATENT DOCUMENTS

| JP | 7-181414 A | 7/1995 |
| JP | 8-306980 A | 11/1996 |
| JP | 10-242795 A | 9/1998 |
| JP | 3561544 B2 | 6/2004 |
| JP | 2007-149317 A | 6/2007 |
| JP | 2007-271788 A | 10/2007 |

* cited by examiner

*Primary Examiner* — Frank Font
(74) *Attorney, Agent, or Firm* — Crowell & Moring LLP

(57) ABSTRACT

A vibrating mirror element includes a base member, a substrate made of metal, integrally formed with a mirror portion, a movable portion swingably supporting the mirror portion from both sides and functioning as a lower electrode, and a mounting portion supporting the movable portion and mounted on the base member, a piezoelectric film provided on the movable portion of the substrate and vibrating the mirror portion by application of a periodic voltage, and an upper electrode provided on the piezoelectric film.

20 Claims, 5 Drawing Sheets

VIBRATING MIRROR ELEMENT

BACKGROUND OF THE INVENTION

1. Field of the Invention

The present invention relates to a vibrating mirror element, and more particularly, it relates to a vibrating mirror element comprising a movable portion vibrating with a piezoelectric film.

2. Description of the Background Art

A vibrating mirror element comprising a movable portion vibrating with a piezoelectric film is known in general, as disclosed in Japanese Patent Laying-Open No. 7-181414, Japanese Patent No. 3561544 and Japanese Patent Laying-Open Nos. 2007-271788 and 10-242795.

The aforementioned Japanese Patent Laying-Open No. 7-181414 discloses an optical scanner comprising a mirror portion provided with a mirror, a vibration input portion mounted with a piezoelectric element, a plate made of metal integrally formed with an elastic deformation portion provided between the mirror portion and the vibration input portion and a piezoelectric element mounted on the vibration input portion. This optical scanner is so formed that the elastic deformation portion is vibrated by inputting vibration equal to a resonance frequency from the piezoelectric element into the plate, to vibrate the mirror portion provided with the mirror. The optical scanner described in the aforementioned Japanese Patent Laying-Open No. 7-181414 is so formed that the mirror portion is supported in a cantilever manner by the elastic deformation portion and the vibration input portion and the mirror portion corresponding to a forward end portion of this cantilever is vibrated, to scan an object with light reflected from the mirror.

The aforementioned Japanese Patent No. 3561544 discloses a mirror element comprising a substrate, a flat plate shaped piezoelectric element in which a piezoelectric film is held between an upper electrode and a lower electrode, a mirror layer formed on a surface of the piezoelectric element and a support portion provided on the substrate and supporting a first end of the piezoelectric element from a lower portion. A connecting terminal is formed in the support portion formed on the substrate of the mirror element. The lower electrode and the connecting terminal of the piezoelectric element are electrically connected to each other through a conduit formed in the support portion. The aforementioned Japanese Patent No. 3561544 does not describe a material of the substrate of the mirror element.

The aforementioned Japanese Patent Laying-Open No. 2007-271788 discloses a vibrating element comprising a silicon substrate integrally formed with torsion beams swingably supporting a mirror portion arranged on a center and both ends of the mirror portion, a base mounted with the silicon substrate and four piezoelectric elements for swinging the mirror portion. Each torsion beam of the vibrating element has a first end supporting an end of the mirror portion and longitudinally two-forked second ends coupled with a frame portion of the silicon substrate. The piezoelectric elements are arranged on the two-forked portions of the torsion beam (vicinity of the second ends) respectively. The vibrating element described in the aforementioned Japanese Patent Laying-Open No. 2007-271788 is so formed that the four piezoelectric elements in total are provided in the vicinity of the two-forked second ends of a pair of the torsion beams supporting the both ends of the mirror portion and the mirror portion is swung by switching excitation to these piezoelectric elements. Each piezoelectric element has a structure in which a piezoelectric layer is held between an upper electrode and a lower electrode.

The aforementioned Japanese Patent Laying-Open No. 10-242795 discloses a cantilever-shaped piezoelectric element comprising a piezoelectric substrate having upper and lower surfaces formed with metal electrodes and titanium electrodes respectively and a silicon substrate having a holding portion of the piezoelectric substrate. This piezoelectric element is formed with a groove on a side of the lower surface of the piezoelectric substrate. The metal electrode and the titanium electrode formed on the side of the lower surface of the piezoelectric substrate are extracted to outside of the piezoelectric element by forming an extraction portion in the groove of the piezoelectric substrate.

However, the optical scanner described in the aforementioned Japanese Patent Laying-Open No. 7-181414 has a structure in which the mirror portion is supported in the cantilever manner and vibrated, and hence stress is concentrated on the elastic deformation portion supporting on the mirror portion corresponding to the end of the cantilever, thereby easily causing fatigue breakdown. Thus, reliability during long drive is disadvantageously reduced.

In the mirror element described in the aforementioned Japanese Patent No. 3561544, the lower electrode holding the piezoelectric film is electrically connected, and hence the connecting terminal and the conduit must be formed in the support portion supporting the piezoelectric element. Thus, a structure for electrically connecting the lower electrode and outside is disadvantageously complicated.

In the vibrating element described in the aforementioned Japanese Patent Laying-Open No. 2007-271788, the piezoelectric elements are arranged on the respective second ends of the torsion beams employed as the partial silicon substrate, and hence a wiring pattern and the like for electrically connecting not only the upper electrodes of the respective piezoelectric elements but also the lower electrodes must be formed. Thus, a structure for electrically connecting the lower electrodes and outside is disadvantageously complicated.

In the piezoelectric element described in the aforementioned Japanese Patent Laying-Open No. 10-242795, the groove for extracting the electrode on the side of the lower surface is formed on the piezoelectric substrate and the extracting portion of the metal electrode and the titanium electrode must be formed in the groove of the piezoelectric substrate. Thus, a structure for electrically connecting the electrodes on the side of the lower surface and outside is disadvantageously complicated.

SUMMARY OF THE INVENTION

The present invention has been proposed in order to solve the aforementioned problems, and an object of the present invention is to provide a vibrating mirror element improving reliability in long driving and easily electrically connecting a lower electrode and outside.

A vibrating mirror element according to a first aspect of the present invention comprises a base member, a substrate made of metal, integrally formed with a mirror portion, a movable portion swingably supporting the mirror portion from both sides and functioning as a lower electrode, and a mounting portion supporting the movable portion and mounted on the base member, a piezoelectric film provided on the movable portion of the substrate and vibrating the mirror portion by application of a periodic voltage, and an upper electrode provided on the piezoelectric film.

In this vibrating mirror element according to the first aspect, as hereinabove described, the substrate made of metal is integrally formed with the mirror portion and the movable portion swingably supporting the mirror portion from both sides, whereby the mirror portion can be supported from the both sides dissimilarly to a cantilever structure, and hence stress concentration to the movable portion can be relaxed. Metal such of titanium, for example, is employed for the substrate, whereby strength of the substrate itself can be improved as compared with a case of employing a silicon substrate which is a brittle material. Thus, reliability in long driving and strength against impact can be improved. The movable portion of the substrate is formed to function as the lower electrode of the piezoelectric film provided on the movable portion, whereby an electrode wire may be simply connected to an arbitrary portion of the substrate, and hence electric connection to outside can be facilitated.

In the aforementioned vibrating mirror element according to the first aspect, the substrate is preferably made of titanium or titanium alloy. According to this structure, the substrate has excellent strength, impact resistance and fatigue strength and can be made of titanium or titanium alloy utilizable as an electrode material, and hence reliability and strength of the vibrating mirror element can be improved.

In the aforementioned vibrating mirror element according to the first aspect, the mounting portion is preferably provided in the form of a frame so as to enclose the movable portion and the mirror portion. According to this structure, the mounting portion integrally formed with the movable portion of the substrate functioning as the lower electrode of the piezoelectric film is in the form of the frame, and hence a wire can be connected to the frame-shaped mounting portion from any direction. Thus, electric connection to outside can be easily performed.

In this case, the movable portion preferably includes a pair of rotating shaft portions having first ends connected to the mirror portion and a pair of deforming portions connected to second ends of the pair of rotating shaft portions respectively and extending substantially perpendicular to the pair of rotating shaft portions and arranged with pairs of the piezoelectric films in alignment at a prescribed interval respectively. According to this structure, the pairs of piezoelectric films are arranged in alignment, and hence the voltages of opposite phases to each other are applied to the pairs of the piezoelectric films, thereby causing deflection in opposite directions to each other along the deforming portions arranged with the piezoelectric films. Thus, the deflection can be easily converted to rotation of the rotating shaft portions.

In the aforementioned structure in which the movable portion includes the rotating shaft portions and the deforming portions, a width of each of the rotating shaft portions in a short-side direction is preferably smaller than a width of each of the deforming portions in a short-side direction. According to this structure, the rotating shaft portions having widths smaller than the widths of the deforming portions are easily twisted following rotation when the rotating shaft portions are rotated by deflection of the deforming portions. Thus, amplitude during rotation of the rotating shaft portions can be increased, and hence the rotating shaft portions can be further easily rotated.

In aforementioned structure in which the mounting portion is provided in the form of a frame, the frame-shaped mounting portion is preferably so mounted on the base member that an overall area of the mounting portion substantially overlaps with one part of the base member in plan view. According to this structure, the mounting portion can be so mounted on the base member that the overall area of the frame-shaped mounting portion enclosing the movable portion (the mirror portion and the movable portion) of the substrate is placed on the base member, and hence the mounting portion can stably support the movable portion of the substrate.

In this case, the mounting portion of the substrate made of metal is preferably mounted on the base member by soldering. According to this structure, the lower electrode and the base member can be electrically connected to each other by simply mounting the substrate on the base member by soldering. Thus, electric connection to outside can be further easily performed when electric connection to the base member can be performed.

In the aforementioned structure in which the mounting portion is mounted on the base member by soldering, a junction by the soldering is preferably electrically connectable to outside. According to this structure, the junction electrically connectable to outside and the substrate functioning as the lower electrode can be electrically connected to each other by simply mounting the mounting portion on the base member by soldering.

In this case, the base member preferably includes a connecting terminal portion provided electrically connectable to outside, and the connecting terminal portion is preferably electrically connected to the junction of the substrate and the base member by the soldering. According to this structure, wiring to the lower electrode can be easily performed by simply mounting the mounting portion on the base member provided with the connecting terminal portion by soldering.

In the aforementioned vibrating mirror element according to the first aspect, the substrate is preferably made of a metallic material having a positive expansion coefficient, and the base member is preferably made of a negative expansion coefficient material. According to this structure, when the inner stress state of the substrate is changed by thermal expansion and a resonance frequency is changed in driving, the base member made of the negative expansion coefficient material mounted with the substrate causes contraction deformation, so that change of the inner stress state due to thermal expansion of the substrate having the positive expansion coefficient can be canceled, and hence change of the resonance frequency of the vibrating mirror element with respect to temperature change can be suppressed.

In the aforementioned vibrating mirror element according to the first aspect, the substrate is preferably made of a metallic material mainly composed of a metallic element contained in a constituent element of the piezoelectric film. According to this structure, when lead zirconate titanate ($Pb(Zr,Ti)O_3$: PZT), for example, is employed as the piezoelectric film, a PZT film must be formed on the substrate made of metal. At this time, when iron (Fe) not contained in the constituent element of PZT, for example, is employed as the substrate made of metal, the material of the PZT film is conceivably deteriorated resulting from diffusion of Fe in film formation of PZT and a piezoelectric property is conceivably degraded. On the contrary, when the metallic material mainly composed of the metallic element contained in the constituent element constituting the piezoelectric film is employed for the substrate, the metallic element contained in the constituent element of the piezoelectric film is diffused also in a case where the material of the substrate is diffused in forming the piezoelectric film. Thus, deterioration of a piezoelectric property due to degradation of the material of the piezoelectric film can be conceivably suppressed.

In this case, the substrate is preferably made of titanium, and the piezoelectric film is preferably made of an oxide mainly composed of lead, titanium and zirconium. According to this structure, the piezoelectric film mainly composed of lead, titanium and zirconium can be formed on the substrate made of titanium contained in the constituent element of the piezoelectric film, and hence deterioration of a piezoelectric property due to degradation of the material of the piezoelectric film can be conceivably suppressed. The substrate is made of titanium having excellent strength, impact resistance and fatigue strength, and hence reliability and strength of the vibrating mirror element can be improved.

In the aforementioned structure in which the substrate is made of the metallic material mainly composed of the metallic element containing in the constituent element of the piezoelectric film, the piezoelectric film is preferably made of an oxide mainly composed of lead, titanium and zirconium, and an intermediate layer made of a material having a perovskite structure and containing no zirconium is preferably formed between the substrate made of metal and the piezoelectric film. According to this structure, the intermediate layer is formed between the substrate functioning as the lower electrode and the piezoelectric film, so that growth of crystals can be inhibited from blocking by zirconium becoming an oxide and depositing on the surface of the formed film when the oxide mainly composed of lead (Pb), titanium (Ti) and zirconium (Zr) is directly formed on the lower electrode. Thus, the piezoelectric film (oxide mainly composed of lead, titanium and zirconium) having a small number of defects can be formed, and hence reduction of the property of the piezoelectric film can be suppressed. The oxide mainly composed of lead, titanium and zirconium includes lead zirconate titanate ($Pb(Zr,Ti)O_3$:PZT) or the like.

In the aforementioned case where the intermediate layer is formed between the substrate made of metal and the piezoelectric film, the intermediate layer preferably includes any of lead lanthanum titanate, lead titanate, strontium titanate and strontium ruthenate. The intermediate layer can be formed employing such a material.

In the aforementioned case where the intermediate layer is formed between the substrate made of metal and the piezoelectric film, the intermediate layer is preferably formed on the substrate through a platinum layer. According to this structure, the intermediate layer can be formed on the layer of platinum (Pt) suitable for an underlayer material having a lattice constant close to that of PZT when PZT is employed as the piezoelectric film, and hence the piezoelectric film (oxide mainly composed of lead, titanium and zirconium) having a small number of defects can be easily formed.

In this case, the platinum layer is preferably formed on a region formed with the intermediate layer and a region constituting the mirror portion on a surface of the substrate. According to this structure, the platinum layer is formed not only on the region formed with the intermediate layer but also on the surface of the mirror portion, and hence a reflection property of the mirror surface (reflected surface) can be improved.

In the aforementioned structure in which the platinum layer is formed on the region formed with the intermediate layer and the region constituting the mirror portion on the surface of the substrate, the platinum layer is preferably formed on the substantially overall surface of the substrate. According to this structure, the platinum layer may be simply formed on the substantially overall surface of the substrate as compared with a case where the platinum layer is formed only on a prescribed region employing a mask, for example, and hence the platinum layer can be easily formed on the substrate.

In the aforementioned structure in which the frame-shaped mounting portion is mounted on the base member by soldering, the frame-shaped mounting portion preferably has an outer shape rectangularly formed in plan view and is mounted on the base member in the vicinity of four corners by soldering. According to this structure, vicinity of the four corners of the rectangular mounting portion can be fixed by soldering, and hence the substrate can be stably fixed.

In the aforementioned vibrating mirror element according to the first aspect, the substrate including the mirror portion, the movable portion and the mounting portion preferably has a uniform thickness. According to this structure, the mirror portion, the movable portion and the mounting portion can be integrally formed directly from a plate-like member having a uniform thickness without adjusting thicknesses of the mirror portion and the movable portion respectively. Thus, the substrate integrally formed with the mirror portion, the movable portion and the mounting portion can be easily formed.

In a vibrating mirror element according to a second aspect of the present invention comprises a base member, a substrate made of titanium, integrally formed with a mirror portion, a movable portion swingably supporting the mirror portion from both sides and functioning as a lower electrode, and a mounting portion supporting the movable portion and mounted on the base member, a piezoelectric film made of an oxide mainly composed of lead, titanium and zirconium, provided on the movable portion of the substrate and vibrating the mirror portion by application of a periodic voltage, and an upper electrode provided on the piezoelectric film.

In this vibrating mirror element according to the second aspect, as hereinabove described, the substrate made of titanium is integrally formed with the mirror portion and the movable portion swingably supporting the mirror portion from both sides, whereby the mirror portion can be supported from the both sides dissimilarly to a case where the formed movable portion of the substrate has a cantilever structure, and hence stress concentration to the movable portion can be relaxed. Additionally, titanium is employed for the substrate, whereby strength of the substrate itself can be improved as compared with a case of employing a silicon substrate which is a brittle material. Thus, reliability in long driving and strength against impact can be improved. The movable portion of the substrate is formed to function as the lower electrode of the piezoelectric film provided on the movable portion, whereby an electrode wire may be simply connected to an arbitrary portion of the substrate, and hence electric connection to outside can be facilitated.

The substrate is made of titanium, and the piezoelectric film is made of the oxide mainly composed of lead, titanium and zirconium, whereby titanium contained in the constituent element (lead, titanium and zirconium) of the piezoelectric film is diffused also when the material of the substrate is diffused in forming the piezoelectric film. Thus, deterioration of a piezoelectric property due to degradation of the material of the piezoelectric film can be conceivably suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described with reference to the drawings.

A structure of a vibrating mirror element 100 according to an embodiment of the present invention will be now described with reference to FIGS. 1 to 4.

Figure 1:
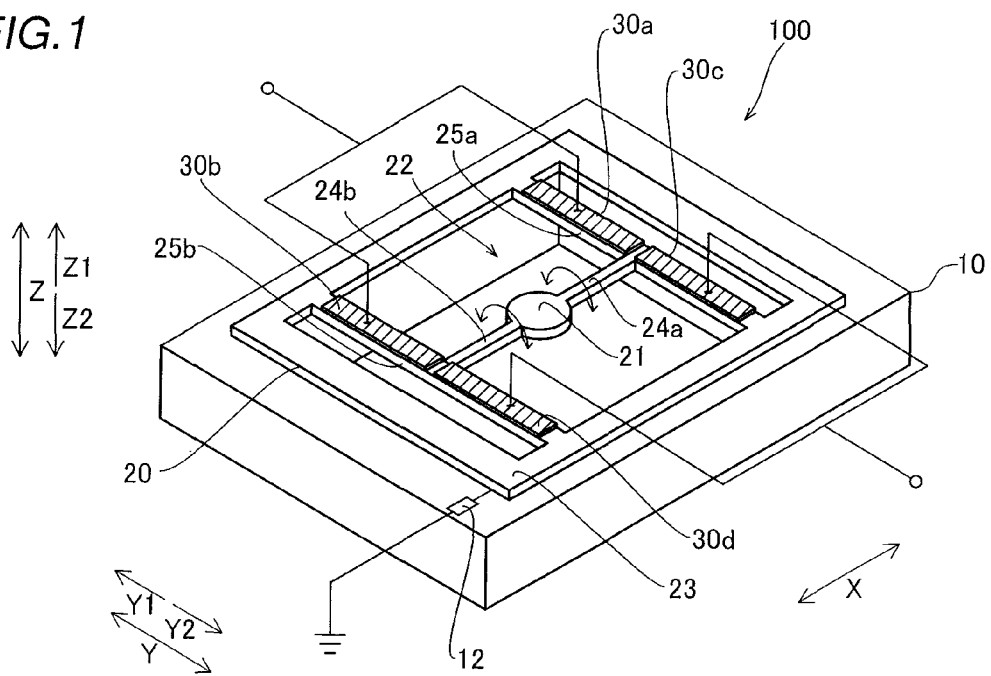
FIG. 1 is a perspective view showing an overall structure of a vibrating mirror element according to an embodiment of the present invention.

The vibrating mirror element 100 according to the embodiment of the present invention is constituted by a base member 10, a substrate 20 and four piezoelectric elements 30a to 30d arranged on the substrate 20, as shown in FIG. 1.

Figure 2:
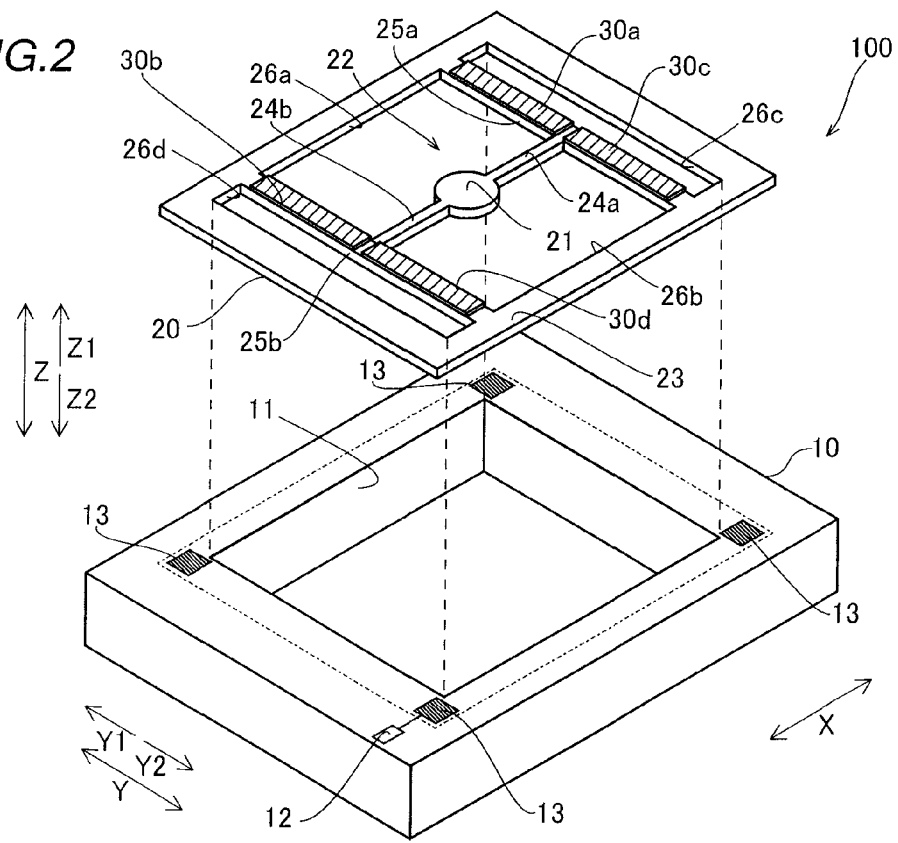
FIG. 2 is an exploded perspective view showing the overall structure of the vibrating mirror element according to the embodiment of the present invention.
Figure 3:
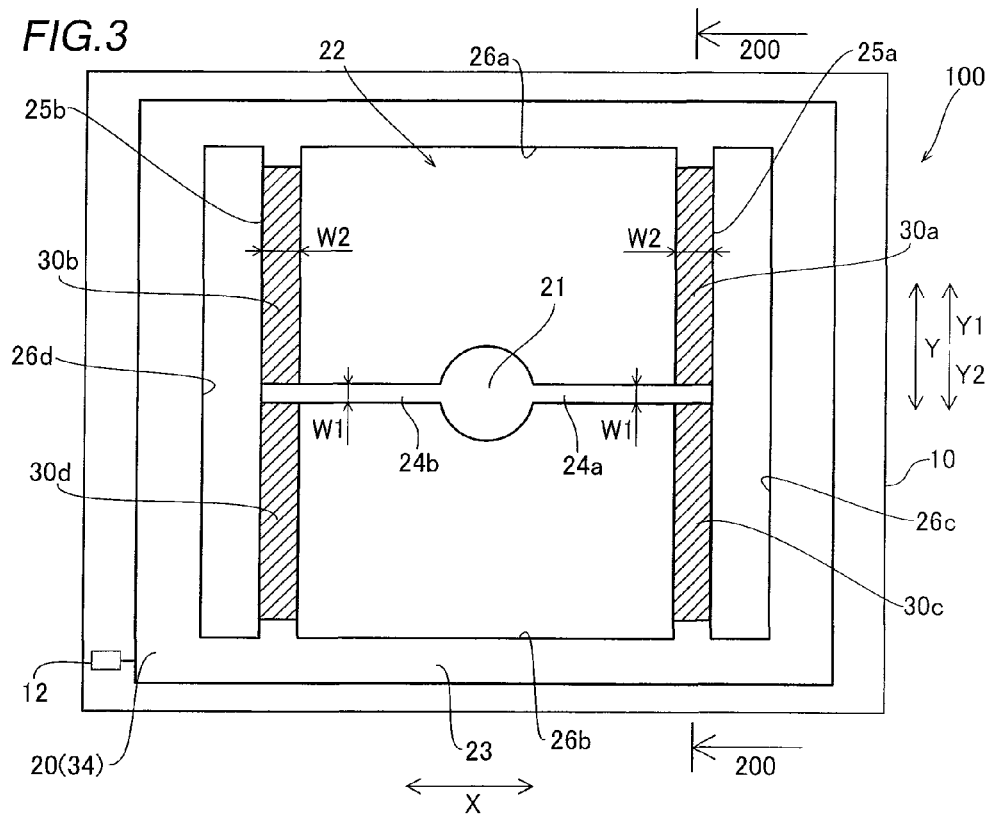
FIG. 3 is a plan view showing the overall structure of the vibrating mirror element according to the embodiment of the present invention.

As shown in FIG. 2, the base member 10 of the vibrating mirror element 100 has a frame shape in which an opening 11 is formed on a central portion. As shown in FIG. 3, the base member 10 has a square shape in plan view. This base member 10 serves to fix the substrate 20 by mounting a mounting portion 23, described later, of the substrate 20 on a prescribed mounting region (inner region shown by alternate long and short dash lines in FIG. 2). The opening 11 of the base member 10 has a square shape in plan view, and is formed on a region corresponding to a region where a mirror portion 21 and a movable portion 22, described later, of the substrate 20 arranged on an upper surface of the base member 10 are arranged. In other words, the mirror portion 21 and the movable portion 22 of the substrate 20 are formed to be arranged on the opening 11 of the base member 10.

As shown in FIG. 2, a connecting terminal portion 12 electrically connected to one of junctions 13 is formed on the surface of the base member 10. The junctions 13 are enabled to be electrically connected to outside by this connecting terminal portion 12. Four of the junctions 13 are formed on a region overlapping with the mounting portion 23 of the substrate 20 (inner region shown by alternate long and short dash lines in FIG. 2) in plan view. More specifically, the junctions 13 are arranged in the vicinity of four corners of the mounting portion 23 having a rectangular frame shape. The mounting portion 23 is mounted on the respective junctions 13 by soldering, so that the substrate 20 is fixed to the base member 10.

According to this embodiment, the base member 10 is formed by a negative expansion coefficient material. The negative expansion coefficient material means a material having a negative value of a thermal expansion coefficient, e.g., a composite oxide such as zirconium tungstate ($ZrW_2O_2$) or silicon oxide ($Li_2$—$Al_2O_3$-$nSiO_2$), for example. The negative expansion coefficient materials illustrated here have insulating properties respectively. The base member 10 formed by these negative expansion coefficient materials has an insulating property and is formed to contract following increase of temperature. Thus, the base member 10 is formed to cancel thermal expansion of the substrate 20 caused by increase of temperature during drive by contraction deformation when the substrate 20 made of a material having a positive expansion coefficient is mounted on the base member 10.

Figure 4:
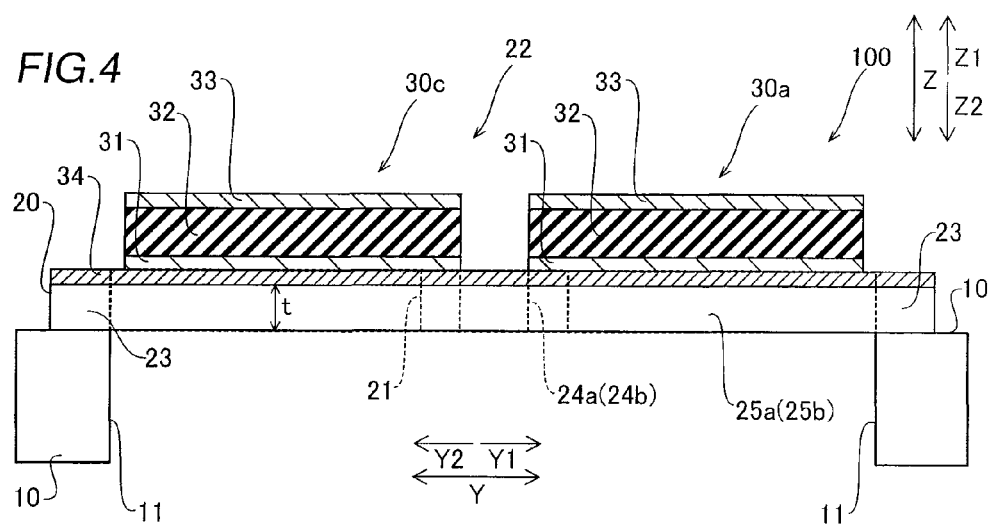
FIG. 4 is a sectional view taken along the line 200-200 of the vibrating mirror element according to the embodiment of the present invention shown in FIG. 3.

The substrate 20 of the vibrating mirror element 100 is constituted by the mirror portion 21, the H-shaped movable portion 22 swingably supporting the mirror portion 21 from both sides in a direction X, and the mounting portion 23, as shown in FIG. 3. In the substrate 20, openings 26a to 26d are provided on a region, formed with no mirror portion 21 and no movable portion 22, of inside of the mounting portion 23. The mirror portion 21, the movable portion 22 and the mounting portion 23 of the substrate 20 are integrally formed on the substrate 20. As shown in FIG. 4, the substrate 20 including the mirror portion 21, the movable portion 22 and the mounting portion 23 has a uniform thickness t.

According to this embodiment, the substrate 20 is made of titanium (Ti) having a positive expansion coefficient. Titanium (Ti) forming the substrate 20 is a constituent element constituting piezoelectric films 32 made of PZT (Pb(Zr,Ti)$O_3$) described later. The substrate 20 is formed to function as lower electrodes of the piezoelectric films 32 (see FIG. 4) constituting the piezoelectric elements 30a to 30d arranged on the movable portion 22. Thus, wiring to the lower electrodes of the piezoelectric elements 30a to 30d can be performed with respect to an arbitrary portion of the substrate 20.

According to this embodiment, the frame-shaped mounting portion 23 is mounted on the junctions 13 formed on the base member 10 by soldering, so that the substrate 20 is electrically connected to the connecting terminal portion 12 formed on the base member 10. Thus, wiring to the lower electrodes of the piezoelectric elements 30a to 30d can be performed by simply mounting the substrate 20 on the base member 10. As shown in FIG. 1, this substrate 20 is so formed as to be grounded through the connecting terminal portion 12. A platinum (Pt) layer 34 (see FIG. 4), described later, is formed on an overall surface of the substrate 20 in order to improve properties of the piezoelectric elements 30a to 30d and reflectivity of the mirror portion 21.

The mirror portion 21 of the substrate 20 has a circular flat plate shape in plan view. As shown in FIG. 3, both ends of this mirror portion 21 on an axis line in the direction X passing through a center are swingably supported by rotating shaft portions 24a and 24b, described later, of the movable portion 22. When the movable portion 22 is vibrated by applying periodic voltages to the piezoelectric elements 30a to 30d, the mirror portion 21 resonantly vibrates about the rotating shaft portions 24a and 24b serving as the rotating shaft by this vibration of the movable portion 22. At this time, when a laser beam is applied to the mirror portion 21, an angle of reflection of reflected light is changed in response to a rotation angle of the mirror portion 21. Thus, the vibrating mirror element 100 has a function of scanning an object with reflected light such as the laser beam applied to the mirror portion 21.

According to this embodiment, the movable portion 22 of the substrate 20 has an H-shape in which the mirror portion 21 is positioned at a center in plan view. In other words, the movable portion 22 includes a pair of the rotating shaft portions 24a and 24b having first ends connected to the mirror portion 21 and a pair of deforming portions 25a and 25b connected to second ends of the pair of rotating shaft portions 24a and 24b and extending in a direction Y substantially orthogonal to the pair of rotating shaft portions 24a and 24b. Both ends of the pair of deforming portions 25a and 25b, extending in the direction Y are connected to sides of the frame-shaped mounting portion 23 opposed in the direction Y respectively. Therefore, the pair of deforming portions 25a and 25b of the movable portion 22 are so formed that the respective both ends thereof in the direction Y are supported by the frame-shaped mounting portion 23. The mirror portion 21 arranged on the center of the movable portion 22 is supported by the rotating shaft portions 24a and 24b from both ends in a swing shaft direction (direction X). As shown in FIG. 3, the pair of rotating shaft portions 24a and 24b have widths W1 in a short-side direction (direction Y) respectively. The pair of deforming portions 25a and 25b have widths W2 in a short-side direction (direction X) respectively. The width W1 and the width W2 have a relation of W1<W2. In other words, the widths W1 of the rotating shaft portions 24a and 24b in the short-side direction are smaller than the widths W2 of the deforming portions 25a and 25b in the short-side direction.

Pairs of the piezoelectric elements 30a to 30d including the piezoelectric films 32 described later are arranged on the respective deforming portions 25a and 25b of the movable portion 22 in alignment at a prescribed interval. More specifically, the platelike piezoelectric elements 30a and 30c are arranged on both longitudinal sides (in the direction Y), holding the central portion formed with the of the rotating shaft portion 24a therebetween, of the deforming portion 25a of the movable portion 22 in alignment along an extensional direction (direction Y) of the deforming portion 25a, respectively. Similarly, the platelike piezoelectric elements 30b and 30d are arranged on both longitudinal sides (in the direction Y), holding the central portion formed with the rotating shaft portion 24b therebetween, of the deforming portion 25b in alignment along the extensional direction (direction Y) of the deforming portion 25b, respectively. Therefore, the movable portion 22 is arranged with the four piezoelectric elements 30a to 30d in total on the pair of deforming portions 25a and 25b. The piezoelectric elements 30a to 30d are formed to expand/contract in the direction Y by voltage application. Respective regions, formed with the piezoelectric elements 30a to 30d, of the deforming portions 25a and 25b are curved in a projecting shape (in expansion) or a recessed shape (in contraction) by expansion/contraction of the piezoelectric elements 30a to 30d. Thus, the central portions formed with the rotating shaft portions 24a and 24b are inclined at prescribed angles by curvature of the deforming portions 25a and 25b, so that the mirror portion 21 supported by the rotating shaft portions 24a and 24b are swung.

The mounting portion 23 of the substrate 20 is in the form of a frame so as to enclose the region formed with the mirror portion 21 and the movable portion 22. Thus, the mounting portion 23 is in the form of the frame, whereby rigidity of the overall substrate 20 is improved and handling is facilitated, and electric connection of the substrate 20 functioning as the lower electrodes of the piezoelectric elements 30a to 30d can be facilitated. As shown in FIG. 2, this mounting portion 23 is so formed that the region formed with the mirror portion 21 and the movable portion 22 has substantially the same as the opening 11 of the base member 10. As shown in FIG. 2, the mounting portion 23 is so mounted on the base member 10 that the overall area of the mounting portion 23 provided in the form of the frame overlaps with the prescribed mounting region (inner region shown by alternate long and short dash lines in FIG. 2) of an upper surface of the base member 10.

As shown in FIG. 3, the opening 11 of the base member 10 is arranged below the region formed with the mirror portion 21 and the movable portion 22 in the mounting portion 23, in a state where the substrate 20 is mounted on the base member 10 at the mounting portion 23. Thus, the vibrating mirror element 100 can be driven without interference between the mirror portion 21 and the base member 10 and between the movable portion 22 and the base member 10 in driving.

As shown in FIG. 4, each of the piezoelectric elements 30a and 30c formed on the deforming portion 25a is constituted by an intermediate layer 31, the piezoelectric film 32 and an upper electrode 33 formed on the surface of the substrate 20 through the platinum (Pt) layer 34. The piezoelectric films 32 made of PZT are polarized in a thickness direction (direction Z), so that the piezoelectric elements 30a to 30d expand/contract in the direction Y when voltages are applied by the upper electrodes 33 and the substrate 20 and the platinum layer 34 employed as the lower electrodes. PZT is an example of the "oxide mainly composed of lead, titanium and zirconium" in the present invention. The piezoelectric elements 30a to 30d have the same structure and the same shape respectively. The piezoelectric element 30a will be hereinafter taken for example for description.

According to this embodiment, the intermediate layer 31 of the piezoelectric element 30a is made of a material having a crystal structure of a perovskite structure containing no zirconium (Zr). For example, lead lanthanum titanate ((Pb,La)TiO$_3$(=PLT)), lead titanate (PbTiO$_3$), strontium titanate (SrTiO$_3$), strontium ruthenate (SrRuO$_3$) or the like can be employed for this intermediate layer 31. This intermediate layer 31 is formed between the platinum layer 34 and the piezoelectric film 32 made of PZT, whereby zirconium is deposited as an oxide on an interface between the platinum layer 34 and the piezoelectric film 32, and inhibition of crystal growth of the piezoelectric film 32 made of PZT is suppressed. This intermediate layer 31 is formed to have a thickness of at least several 10 nm and not more than about 100 nm.

According to this embodiment, the piezoelectric film 32 made of PZT is formed on the upper surface of the intermediate layer 31. The piezoelectric film 32 is formed to have about 2 μm to 3 μm. The upper electrode 33 is formed on the upper surface of the piezoelectric film 32. This upper electrode 33 is made of chromium (Cr), platinum (Pt), aluminum (Al), gold (Au) or the like, for example. A thickness of the upper electrodes 33 is at least about 100 nm and not more than about 500 nm.

The platinum layer 34 is formed on the overall surface of the substrate 20. Therefore, this platinum layer 34 is formed also on a region constituting the mirror portion 21 other than regions formed with the piezoelectric elements 30a to 30d of the substrate 20. The platinum layer 34 has a function of improving a reflection property of a mirror surface in the surface of the mirror portion 21. On the other hand, the platinum layer 34 has a function as lower electrodes of the piezoelectric film 32 together with the substrate 20 on the regions formed with the piezoelectric elements 30a to 30d. In other words, each of the piezoelectric elements 30a to 30d is formed to have a common lower electrode constituted by the platinum layer 34 and the substrate 20. A thickness of the platinum layer 34 is at least about 100 nm and not more than about 500 nm similarly to the upper electrodes 33.

As described above, the piezoelectric element 30a has a multilayer structure in which the piezoelectric film 32 formed on the intermediate layer 31 is held between the upper electrode 33 and the substrate 20 and the platinum layer 34 which are the lower electrodes.

A driving operation of the vibrating mirror element 100 according to the embodiment of the present invention will be now described with reference to FIG. 1 and FIGS. 5 to 7.

Figure 5:
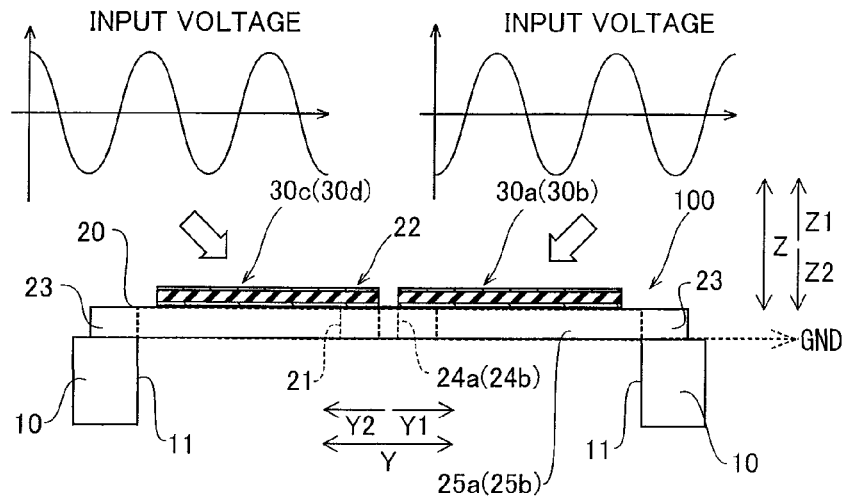
FIGS. 5 to 7 are diagrams for illustrating a method of driving the vibrating mirror element according to the embodiment of the present invention.

As shown in FIG. 5, a sinusoidal voltage having a frequency substantially equal to a resonance frequency of the vibrating mirror element 100 is applied to each of the upper electrodes 33 of the piezoelectric elements 30a to 30d, which is connected to an external power source (see FIG. 1). As shown in FIG. 1, voltages of the same phase (see FIG. 5) are applied to the piezoelectric elements 30a and 30b arranged on a side along arrow Y1 in the four piezoelectric elements 30a to 30d, respectively. Voltages (see FIG. 5) of opposite phase to voltages applied to the piezoelectric elements 30a and 30b arranged on the side along arrow Y1 are applied to the piezoelectric elements 30c and 30d arranged on a side along arrow Y2. The substrate 20 functions as a common lower electrode of the four piezoelectric elements 30a to 30d and grounded. Thus, deformation of the deforming portions 25a and 25b due to expansion/contraction of the piezoelectric elements 30a to 30d coincide with each other as viewed from the direction X.

Figure 6:
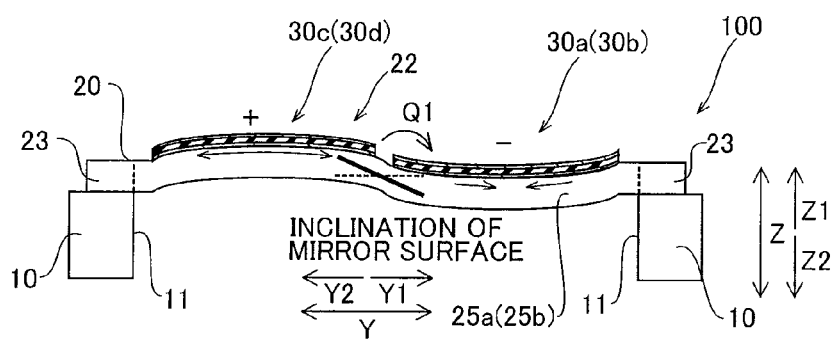

As shown in FIG. 5, it is assumed that input voltages of opposite phases to each other are applied to the piezoelectric elements 30a and 30c arranged on the deforming portion 25a. At this time, when a negative voltage is applied to the piezoelectric element 30a on the side along arrow Y1, the piezoelectric element 30a contracts in the direction Y and the portion, formed with the piezoelectric element 30a, of the deforming portion 25a is deflected in a recessed shape, as shown in FIG. 6. On the other hand, a positive voltage of opposite phase is applied to the piezoelectric element 30c on the side along arrow Y2 and the piezoelectric element 30c is displaced to expand in the direction Y. Thus, the portion, formed with the piezoelectric element 30c, of the deforming portion 25a is deflected in a projecting shape due to expansion/contraction of the piezoelectric element 30c. The deforming portion 25b is also deformed in the similar manner, and hence the deforming portions 25a and 25b are so deformed that the side along arrow Y1 from the central portion is relatively low (on the side along arrow Z2), while the side along arrow Y2 is relatively high (on the side along arrow Z1). Thus, the rotating shaft portions 24a and 24b formed on the central portions of the deforming portions 25a and 25b are inclined along arrow Q1, and hence the mirror portion 21 supported by the rotating shaft portions 24a and 24b rotates along arrow Q1.

Figure 7:
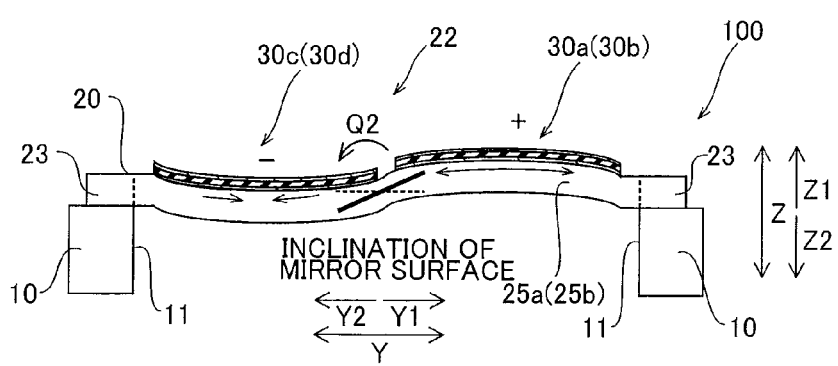

On the contrary, when a positive voltage is applied to the piezoelectric element 30a on the side along arrow Y1 and a negative voltage is applied to the piezoelectric element 30c on the side along arrow Y2, the portion, formed with the piezoelectric element 30a, of the deforming portion 25a is deflected in a projecting shape due to expansion/contraction of the piezoelectric element 30a and the portion, formed with the piezoelectric element 30c, of the deforming portion 25a is deflected in a recessed shape due to expansion/contraction of the piezoelectric element 30c, as shown in FIG. 7. At this time, the deforming portion 25b is also deformed in the similar matter, and hence the deforming portions 25a and 25b are so deformed that the side along arrow Y1 from the central portion is relatively high (on the side along arrow Z1), while the side along arrow Y2 is relatively low (on the side along arrow Z2). Thus, the rotating shaft portions 24a and 24b formed on the central portions of the deforming portions 25a and 25b are inclined along arrow Q2, and hence the mirror portion 21 supported by the rotating shaft portions 24a and 24b rotates along arrow Q2.

As hereinabove described, input voltages of opposite phases to each other are applied to the piezoelectric elements 30a and 30b on the side along arrow Y1 and the piezoelectric elements 30c and 30d on the side along arrow Y2 holding the central portions, formed with the rotating shaft portions 24a and 24b, of the deforming portions 25a and 25b therebetween at a frequency substantially equal to the resonance frequency of the vibrating mirror element 100, whereby the mirror portion 21 performs resonant vibration repeating swing at a prescribed angle.

A manufacturing process for the vibrating mirror element 100 according to the embodiment of the present invention will be now described with reference to FIGS. 2, 3 and 8 to 12.

Figure 8:
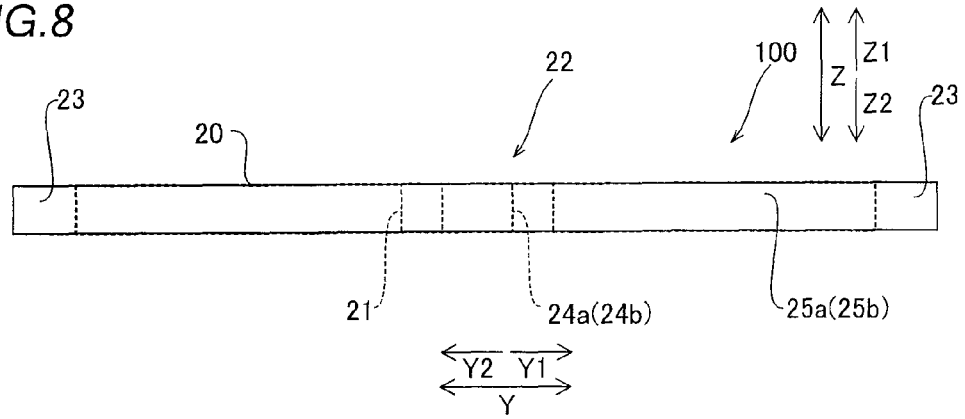
FIGS. 8 to 12 are diagrams for illustrating a manufacturing process of the vibrating mirror element according to the embodiment of the present invention.

As shown in FIG. 8, a titanium thin plate is etched in the form of the substrate 20, thereby forming the substrate 20. At this time, a thickness of the titanium thin plate (thickness t of the substrate 20) can be at least about 5 µm and not more than about 100 µm. As shown in FIG. 3, the substrate 20 in which the mirror portion 21, the movable portion 22 having the rotating shaft portions 24a and 24b and the deforming portions 25a and 25b and the mounting portion 23 are integrally formed with each other is obtained by etching.

Figure 9:
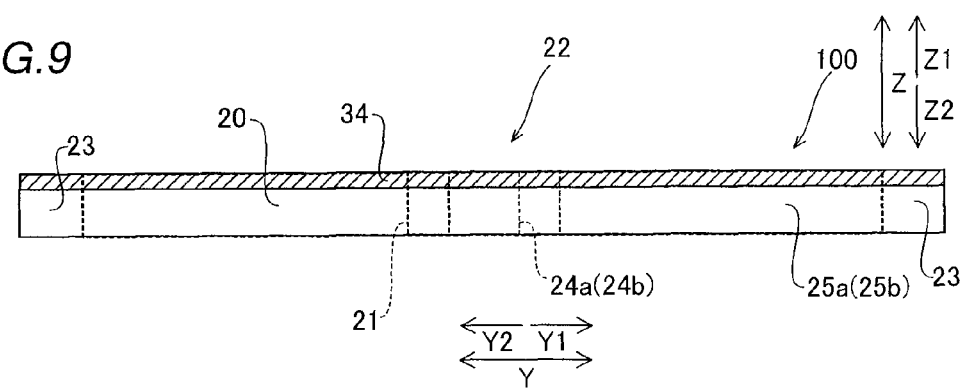

As shown in FIG. 9, the platinum layer 34 is formed on the overall surface of the substrate 20 by sputtering or evaporation.

Figure 10:
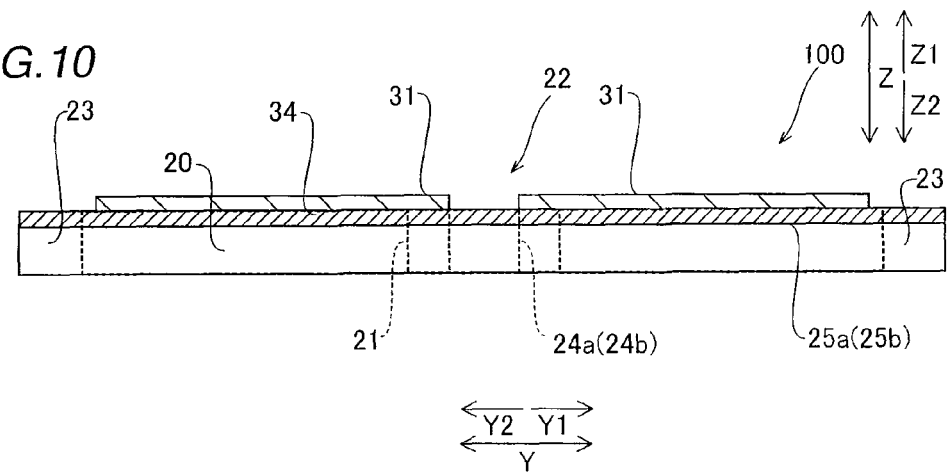

Then, the piezoelectric elements 30a to 30d are formed. As shown in FIG. 10, the intermediate layer 31 is formed on prescribed regions of the deforming portions 25a and 25b. At this time, the intermediate layer 31 is formed by sputtering employing a metal mask patterning the regions formed with the piezoelectric elements 30a to 30d.

Figure 11:
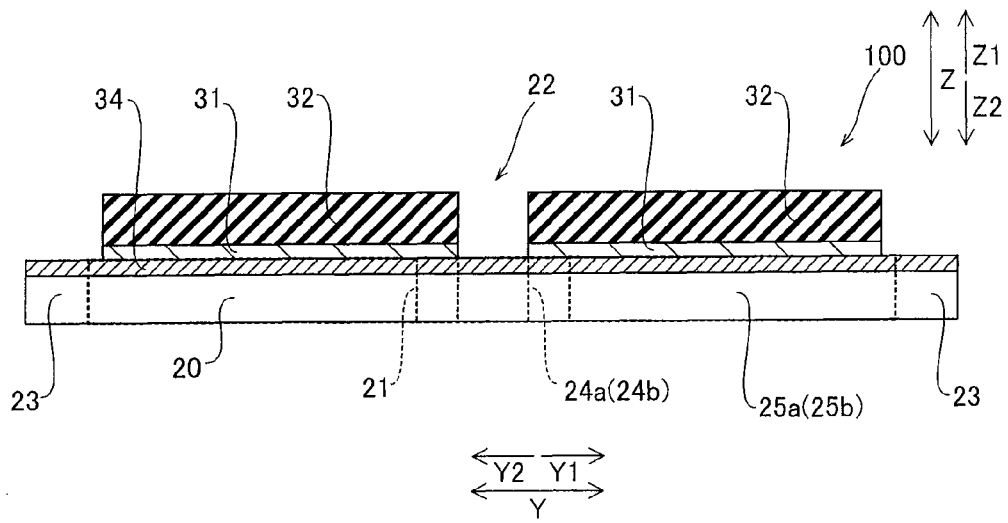

As shown in FIG. 11, the piezoelectric films 32 made of PZT are formed on the intermediate layer 31. The piezoelectric films 32 are formed by sputtering employing the metal mask patterning the regions formed with the piezoelectric elements 30a to 30d, similarly to the intermediate layer 31.

Figure 12:
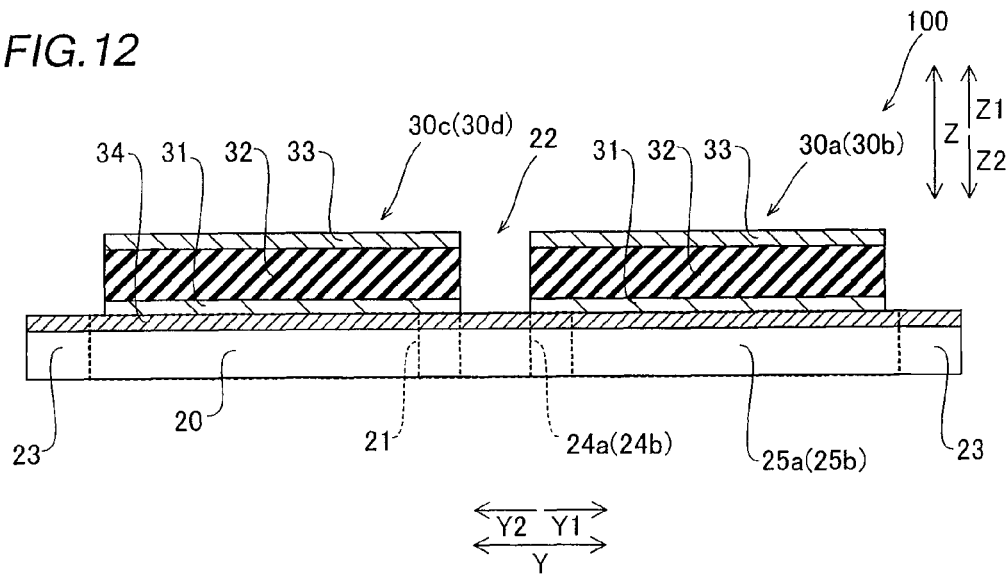

As shown in FIG. 12, the upper electrodes 33 are formed on the piezoelectric films 32. Similarly, the upper electrodes 33 are also formed by sputtering employing the metal mask patterning the regions formed with the piezoelectric elements 30a to 30d.

Thus, the piezoelectric elements 30a to 30d are formed on prescribed regions of the deforming portions 25a and 25b of the substrate 20. Thereafter, the mounting portion 23 of the substrate 20 is mounted on the base member 10 by reflow soldering, as shown in FIG. 2. Soldering is performed on the four junctions 13 on the base member 10. Thus, the substrate 20 employed as the lower electrodes of the piezoelectric films 32 is electrically connected to the connecting terminal portion 12.

The vibrating mirror element 100 according to the embodiment present invention is formed in the aforementioned manner.

According to this embodiment, as hereinabove described, the mirror portion 21 and the movable portion 22 swingably supporting the mirror portion 21 from the both sides are integrally formed in the substrate 20 made of titanium, whereby the mirror portion 21 can be supported from the both sides dissimilarly to a cantilever structure, and hence stress concentration to the movable portion 22 can be relaxed. Titanium is employed for the substrate 20, whereby strength of the substrate 20 itself can be improved as compared with a case of employing a silicon substrate which is a brittle material. Thus, reliability in long driving and strength against impact can be improved. The movable portion 22 of the substrate 20 is formed to function as the lower electrode of each of the piezoelectric films 32 of the piezoelectric elements 30a to 30d provided on the movable portion 22, whereby an electrode wire may be simply connected to an arbitrary portion of the substrate 20, and hence electric connection to outside can be facilitated.

According to this embodiment, as hereinabove described, the substrate 20 is made of titanium, whereby the substrate 20 can be made of titanium having excellent strength, impact resistance and fatigue strength and utilizable as an electrode material, and hence reliability and strength of the vibrating mirror element 100 can be improved.

According to this embodiment, as hereinabove described, the mounting portion 23 is provided in the form of the frame shape so as to enclose the movable portion 22 and the mirror portion 21, whereby the mounting portion 23 integrally formed with the movable portion 22 of the substrate 20 functioning as the lower electrode of each piezoelectric film 32 is in the form of the frame, and hence a wire can be connected to the frame-shaped mounting portion 23 from any direction. Thus, electric connection to outside can be easily performed.

According to this embodiment, as hereinabove described, the movable portion 22 includes the pair of rotating shaft portions 24a and 24b having the first ends connected to the mirror portion 21 and the pair of deforming portions 25a and 25b connected to the second ends of the pair of rotating shaft portions 24a and 24b respectively, extending in the direction Y substantially orthogonal to the pair of rotating shaft portions 24a and 24b and arranged with the pairs of piezoelectric films 32 in alignment at a prescribed interval respectively, whereby the pairs of piezoelectric films 32 are arranged in alignment, and hence the voltages of opposite phases to each other are applied to the pairs of the piezoelectric films 32, thereby causing deflection in opposite directions to each other along the deforming portions 25a and 25b arranged with the piezoelectric films 32 in alignment. Thus, the deflection can be easily converted to rotation of the rotating shaft portions 24a and 24b.

According to this embodiment, as hereinabove described, the widths W1 of the rotating shaft portions 24a and 24b in the short-side direction (direction Y) are smaller than the widths W2 of the deforming portions 25a and 25b in the short-side direction (direction X), whereby the rotating shaft portions 24a and 24b having widths smaller than the widths W2 of the deforming portions 25a and 25b are easily twisted following rotation when the rotating shaft portions 24a and 24b are rotated by deflection of the deforming portions 25a and 25b. Thus, amplitude during rotation of the rotating shaft portions 24a and 24b can be increased, and hence the rotating shaft portions 24a and 24b can be further easily rotated.

According to this embodiment, as hereinabove described, the frame-shaped mounting portion 23 is so mounted on the base member 10 that the overall area of the mounting portion 23 overlaps with one part of the base member 10 in plan view, whereby the overall area of the frame-shaped mounting portion 23 enclosing the movable portion (the mirror portion 21 and the movable portion 22) of the substrate 20 is so mounted as to be placed on the base member 10, and hence the mounting portion 23 can stably support the movable portion (the mirror portion 21 and the movable portion 22) of the substrate 20.

According to this embodiment, as hereinabove described, the mounting portion 23 of the substrate 20 made of titanium is mounted on the base member 10 by soldering, whereby the lower electrodes of the piezoelectric elements 30a to 30d and the base member 10 can be electrically connected to each other by simply mounting the substrate 20 on the base member 10 by soldering. Thus, electric connection to outside can be further easily performed when electric connection to the base member 10 can be performed.

According to this embodiment, as hereinabove described, the junctions 13 by soldering are so formed as to be electrically connectable to outside by the connecting terminal portion 12, whereby the junctions 13 electrically connectable to outside and the substrate 20 functioning as the lower electrode are electrically connected to each other by simply mounting the mounting portion 23 on the base member 10 by soldering.

According to this embodiment, as hereinabove described, the connecting terminal portion 12 is electrically connected to the junctions 13 connecting the substrate 20 and the base member 10 by soldering, whereby wiring to the lower electrodes can be easily performed by simply mounting the mounting portion 23 on the base member 10 provided with the connecting terminal portion 12 by soldering.

According to this embodiment, as hereinabove described, the substrate 20 is made of a metallic material having a positive expansion coefficient and the base member 10 is made of a negative expansion coefficient material, whereby when the inner stress state of the substrate 20 is changed by thermal expansion and a resonance frequency is changed in driving, the base member 10 made of the negative expansion coefficient material mounted with the substrate 20 causes contraction deformation, so that change of the inner stress state due to thermal expansion of the substrate 20 having the positive expansion coefficient can be canceled, and hence change of the resonance frequency of the vibrating mirror element 100 with respect to temperature change can be suppressed.

According to this embodiment, as hereinabove described, the substrate 20 is made of a metallic material (Ti) mainly composed of a metallic element (Pb, Zr and Ti) contained in a constituent element constituting each piezoelectric film 32 made of PZT, whereby also when the material (Ti) of the substrate 20 is diffused in forming the piezoelectric films 32, the metallic element (Ti) contained in the constituent element (Pb, Zr and Ti) of the piezoelectric film 32 is diffused. Thus, deterioration of a piezoelectric property due to degradation of the material of the piezoelectric film 32 can be conceivably suppressed.

According to this embodiment, as hereinabove described, the piezoelectric films 32 are made of lead zirconate titanate (PZT), and the intermediate layer 31 made of a material having a perovskite structure and containing no zirconium is formed between the substrate 20 made of titanium and the piezoelectric films 32, whereby the intermediate layer 31 is formed between the substrate 20 functioning as the lower electrode and the piezoelectric films 32, so that growth of crystals of PZT can be inhibited from blocking by zirconium (Zr) becoming an oxide and depositing on the surface of the formed film when lead zirconate titanate (PZT) is directly formed on the lower electrodes (the substrate 20 and the platinum layer 34). Thus, the piezoelectric films 32 (PZT) having a small number of defects are formed, and hence reduction of the properties of the piezoelectric films 32 can be suppressed.

According to this embodiment, as hereinabove described, the intermediate layer 31 is formed on the substrate 20 through the platinum layer 34, whereby the intermediate layer 31 can be formed on the layer (platinum layer 34) of platinum (Pt) suitable for an underlayer material having a lattice constant close to that of each piezoelectric film 32 (PZT), and hence the piezoelectric films 32 having a small number of defects can be easily formed.

According to this embodiment, as hereinabove described, the platinum layer 34 is formed on the overall surface of the substrate 20 including the region formed with the intermediate layer 31 and the surface of the mirror portion 21, whereby the platinum layer 34 is formed not only on the region formed with the intermediate layer 31 but also on the surface of the mirror portion 21, and hence a reflection property of the mirror surface (reflected surface) can be improved.

Although the present invention has been described and illustrated in detail, it is clearly understood that the same is by way of illustration and example only and is not to be taken by way of limitation, the spirit and scope of the present invention being limited only by the terms of the appended claims.

For example, while the substrate 20 is made of titanium in the aforementioned embodiment, the present invention is not restricted to this but the substrate may be made of metal other than titanium alloy and titanium.

While the platinum layer 34 is formed on the surface of the substrate 20 functioning as the lower electrodes of the piezoelectric films 32 in the aforementioned embodiment, the present invention is not restricted to this but the platinum layer may not be formed on the substrate. Therefore, the piezoelectric films may not be directly formed on the substrate.

While the piezoelectric films 32 are made of lead zirconate titanate (PZT) in the aforementioned embodiment, the present invention is not restricted to this but the piezoelectric films may be formed by a piezoelectric material made of an oxide mainly composed of lead, titanium or zirconium other than PZT or other piezoelectric material. For example, a piezoelectric material such as zinc oxide (ZnO), lead lanthanum zirconate titanate ((Pb,La)(Zr,Ti)$O_3$), potassium niobate (KNb$O_3$), sodium niobate (NaNb$O_3$) may be employed for the piezoelectric films.

While the base member 10 is made of a composite oxide such as zirconium tungstate (ZrW$_2$O$_2$) or silicon oxide (Li$_2$—Al$_2$O$_3$-nSiO$_2$) which is a negative expansion coefficient material in the aforementioned embodiment, the present invention is not restricted to this but the base member may be made of a material other than the negative expansion coefficient material. For example, the base member may be made of a plastic material. In this case, the plastic material which is inexpensive and easily worked is employed, thereby allowing a low cost.

While the base member 10 is made of a composite oxide such as zirconium tungstate (ZrW$_2$O$_2$) or silicon oxide (Li$_2$—Al$_2$O$_3$-nSiO$_2$) which is an insulating material in the aforementioned embodiment, the present invention is not restricted to this but the base member may be made of a conductive material such as metal. For example, when the base member is made of titanium, the substrate can be electrically connected to the base member by simply mounting the substrate on the base member by soldering. Thus, electric connection to outside can be easily performed.

While the substrate 20 is formed by the titanium thin plate by etching in the aforementioned embodiment, the present invention is not restricted to this but the substrate may be formed by a method such as sandblasting, press-molding, or laser processing other than etching. Any process method is applicable so far as the substrate can be formed in a prescribed shape. The substrate may be formed by a method suitable for a material employed for the substrate.

While the intermediate layer 31, the piezoelectric films 32 and the upper electrodes 33 are formed by sputtering employing the metal mask patterning the regions, formed with the piezoelectric elements 30a to 30b, of the deforming portions 25a and 25b in the aforementioned embodiment, the present invention is not restricted to this but they may be formed by a method such as CVD or a sol-gel process other than sputtering.

While the intermediate layer 31 made of the material containing no zirconium (Zr) and having the crystal structure of the perovskite structure is formed between the platinum layer 34 and the piezoelectric films 32 in the aforementioned embodiment, the present invention is not restricted to this but the piezoelectric films may be formed directly on the platinum layer without forming the intermediate layer 31.

While the movable portion 22 of the substrate 20 has an H-shape in which the mirror portion 21 is positioned at a center in plan view in the aforementioned embodiment, the present invention is not restricted to this but the movable portion may not necessarily have the H-shape. For example, the movable portion 22 may be swingably supported from the both sides of the mirror portion 21 in the direction Y. Although the structure of swingably holding the mirror portion conceivably has various structures, the movable portion may be formed to swingably support the mirror portion from the both sides along the swing shaft.

While the substrate 20 is mounted on the base member 10 by connecting the lower surface of the mounting portion 23 and the junctions 13 of the base member 10 by soldering in the aforementioned embodiment, the present invention is not restricted to this but the substrate may be formed to be mounted on the base member by an adhesive or the like.

While the substrate 20 is electrically connected to the connecting terminal portion 12 formed on the base member 10 by mounting the frame-shaped mounting portion 23 on the junctions 13 formed on the base member 10 by soldering in the aforementioned embodiment, the present invention is not restricted to this but other method may be employed for the method for electrically connecting the substrate to the connecting terminal portion 12. The frame-shaped mounting portion 23 is formed on the substrate 20, and hence a wiring pattern may be formed directly on the connecting terminal portion 12 from an arbitrary position of the mounting portion 23.

While the mounting portion 23 of the substrate 20 is in the form of the frame to enclose the region formed with the mirror portion 21 and the movable portion 22 in the aforementioned embodiment, the present invention is not restricted to this but the mounting portion may not be in the form of the frame. For example, the mounting portion may be formed to couple respective ends of a pair of the deforming portions 25a and 25b, or formed in a shape extending the deforming portions 25a and 25b in a longitudinal direction (direction Y).

While the mirror portion 21 has the circular flat plate shape in plan view in the aforementioned embodiment, the present invention is not restricted to this but the mirror portion may have a square or a rectangle in plan view.

What is claimed is:

1. A vibrating mirror element comprising:
   a base member;
   a substrate made of metal, integrally formed with a mirror portion, a movable portion swingably supporting said mirror portion from both sides and functioning as a lower electrode, and a mounting portion supporting said movable portion and mounted on said base member;
   a piezoelectric film provided on said movable portion of said substrate and vibrating said mirror portion by application of a periodic voltage; and
   an upper electrode provided on said piezoelectric film.

2. The vibrating mirror element according to claim 1, wherein
   said substrate is made of titanium or titanium alloy.

3. The vibrating mirror element according to claim 1, wherein
   said mounting portion is provided in the form of a frame so as to enclose said movable portion and said mirror portion.

4. The vibrating mirror element according to claim 3, wherein
   said movable portion includes a pair of rotating shaft portions having first ends connected to said mirror portion and a pair of deforming portions connected to second ends of said pair of rotating shaft portions respectively and extending substantially perpendicular to said pair of rotating shaft portions and arranged with pairs of said piezoelectric films in alignment at a prescribed interval respectively.

5. The vibrating mirror element according to claim 4, wherein a width of each of said rotating shaft portions in a short-side direction is smaller than a width of each of said deforming portions in a short-side direction.

6. The vibrating mirror element according to claim 3, wherein said frame-shaped mounting portion is so mounted on said base member that an overall area of said mounting portion substantially overlaps with one part of said base member in plan view.

7. The vibrating mirror element according to claim 6, wherein said mounting portion of said substrate made of metal is mounted on said base member by soldering.

8. The vibrating mirror element according to claim 7, wherein a junction by said soldering is electrically connectable to outside.

9. The vibrating mirror element according to claim 8, wherein said base member includes a connecting terminal portion provided electrically connectable to outside, and said connecting terminal portion is electrically connected to said junction of said substrate and said base member by said soldering.

10. The vibrating mirror element according to claim 1, wherein said substrate is made of a metallic material having a positive expansion coefficient, and said base member is made of a negative expansion coefficient material.

11. The vibrating mirror element according to claim 1, wherein said substrate is made of a metallic material mainly composed of a metallic element contained in a constituent element of said piezoelectric film.

12. The vibrating mirror element according to claim 11, wherein said substrate is made of titanium, and said piezoelectric film is made of an oxide mainly composed of lead, titanium and zirconium.

13. The vibrating mirror element according to claim 11, wherein said piezoelectric film is made of an oxide mainly composed of lead, titanium and zirconium, and an intermediate layer made of a material having a perovskite structure and containing no zirconium is formed between said substrate made of metal and said piezoelectric film.

14. The vibrating mirror element according to claim 13, wherein said intermediate layer includes any of lead lanthanum titanate, lead titanate, strontium titanate and strontium ruthenate.

15. The vibrating mirror element according to claim 13, wherein said intermediate layer is formed on said substrate through a platinum layer.

16. The vibrating mirror element according to claim 15, wherein said platinum layer is formed on a region formed with said intermediate layer and a region constituting said mirror portion on a surface of said substrate.

17. The vibrating mirror element according to claim 16, wherein said platinum layer is formed on the substantially overall surface of said substrate.

18. The vibrating mirror element according to claim 7, wherein said frame-shaped mounting portion has an outer shape rectangularly formed in plan view and is mounted on said base member in the vicinity of four corners by soldering.

19. The vibrating mirror element according to claim 1, wherein said substrate including said mirror portion, said movable portion and said mounting portion has a uniform thickness.

20. A vibrating mirror element comprising:

a base member;

a substrate made of titanium, integrally formed with a mirror portion, a movable portion swingably supporting said mirror portion from both sides and functioning as a lower electrode, and a mounting portion supporting said movable portion and mounted on said base member;

a piezoelectric film made of an oxide mainly composed of lead, titanium and zirconium, provided on said movable portion of said substrate and vibrating said mirror portion by application of a periodic voltage; and an upper electrode provided on said piezoelectric film.

* * * * *